(12) United States Patent
Chan

(10) Patent No.: US 9,257,590 B2
(45) Date of Patent: Feb. 9, 2016

(54) PHOTOELECTRIC ELEMENT, DISPLAY UNIT AND METHOD FOR FABRICATING THE SAME

(75) Inventor: Isaac Wing-Tak Chan, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 1401 days.

(21) Appl. No.: 12/972,548

(22) Filed: Dec. 20, 2010

(65) Prior Publication Data

US 2012/0154335 A1 Jun. 21, 2012

(51) Int. Cl.
*G06F 3/042* (2006.01)
*H01L 31/20* (2006.01)
*H01L 31/12* (2006.01)
*H01L 27/12* (2006.01)

(52) U.S. Cl.
CPC ............ *H01L 31/12* (2013.01); *H01L 27/1214* (2013.01)

(58) Field of Classification Search
CPC ................................. G06F 3/042; H01L 31/20
USPC ................... 345/173, 175; 257/53, E31.001, 257/E31.047, E33.077; 438/24
See application file for complete search history.

(56) References Cited

U.S. PATENT DOCUMENTS

| | | | |
|---|---|---|---|
| 4,360,821 A * | 11/1982 | Tsukada et al. | ............... 257/293 |
| 4,931,661 A | 6/1990 | Fukaya et al. | |
| 5,075,237 A | 12/1991 | Wu | |
| 5,306,648 A | 4/1994 | Fukaya et al. | |
| 5,338,690 A | 8/1994 | Fukaya et al. | |
| 5,627,088 A | 5/1997 | Fukaya et al. | |
| 5,864,146 A | 1/1999 | Karellas | |
| 6,566,685 B2 * | 5/2003 | Morikawa et al. | ............... 257/59 |
| 6,642,541 B2 | 11/2003 | Nagata et al. | |
| 6,888,571 B1 | 5/2005 | Koshizuka et al. | |
| 6,992,322 B2 | 1/2006 | Narayan | |
| 7,920,129 B2 * | 4/2011 | Hotelling et al. | ............. 345/173 |
| 8,111,344 B2 * | 2/2012 | Moon et al. | ................... 349/48 |
| 8,421,759 B2 * | 4/2013 | Chien et al. | ................... 345/173 |
| 8,592,931 B2 * | 11/2013 | Hayashi et al. | ............... 257/431 |
| 2001/0030324 A1 * | 10/2001 | Morikawa et al. | ............... 257/59 |
| 2005/0200293 A1 * | 9/2005 | Naugler et al. | ............... 315/149 |
| 2006/0187367 A1 | 8/2006 | Abileah et al. | |
| 2006/0214893 A1 | 9/2006 | Tseng et al. | |
| 2006/0273316 A1 * | 12/2006 | Yang et al. | ...................... 257/59 |

(Continued)

FOREIGN PATENT DOCUMENTS

| | | |
|---|---|---|
| EP | 0178148 | 4/1986 |
| EP | 0804807 | 7/1999 |

(Continued)

OTHER PUBLICATIONS

"Office Action of Taiwan Counterpart Application", issued on Sep. 11, 2013, p. 1-p. 13.

(Continued)

*Primary Examiner* — Kumar Patel
*Assistant Examiner* — Afroza Chowdhury
(74) *Attorney, Agent, or Firm* — Jianq Chyun IP Office

(57) ABSTRACT

A photoelectric element including a transparent bottom electrode, a photosensitive layer, a first electrode, a second electrode and a transparent top electrode is provided. The photosensitive layer is located above the transparent bottom electrode. The first electrode and the second electrode are disposed on the photosensitive layer. The transparent top electrode is located above the photosensitive layer.

5 Claims, 11 Drawing Sheets

(56) References Cited

U.S. PATENT DOCUMENTS

| | | | |
|---|---|---|---|
| 2007/0184576 A1 | 8/2007 | Chang et al. | |
| 2007/0291325 A1 | 12/2007 | Toyota et al. | |
| 2008/0087803 A1 | 4/2008 | Yamamoto | |
| 2008/0158461 A1* | 7/2008 | Kenmochi et al. | 349/46 |
| 2008/0170982 A1 | 7/2008 | Zhang et al. | |
| 2008/0186288 A1 | 8/2008 | Chang | |
| 2008/0245968 A1 | 10/2008 | Tredwell et al. | |
| 2010/0012937 A1* | 1/2010 | Lee et al. | 257/59 |
| 2010/0078231 A1* | 4/2010 | Yeh et al. | 178/18.05 |
| 2010/0194705 A1* | 8/2010 | Kim et al. | 345/173 |
| 2010/0214233 A1* | 8/2010 | Lee | 345/173 |
| 2011/0242750 A1* | 10/2011 | Oakley | 361/679.27 |
| 2012/0273336 A1* | 11/2012 | Kuriki | 200/600 |

FOREIGN PATENT DOCUMENTS

| | | |
|---|---|---|
| TW | 200727520 | 7/2007 |
| TW | 201017883 | 5/2010 |
| TW | 201020883 | 6/2010 |
| TW | 201032206 | 9/2010 |
| WO | 2007058924 | 5/2007 |

OTHER PUBLICATIONS

"Office Action of China Counterpart Application", issued on Dec. 2, 2013, p. 1-p. 13.

* cited by examiner

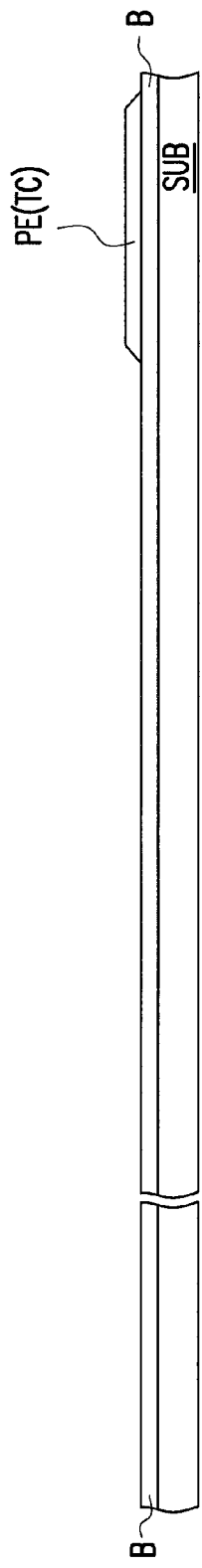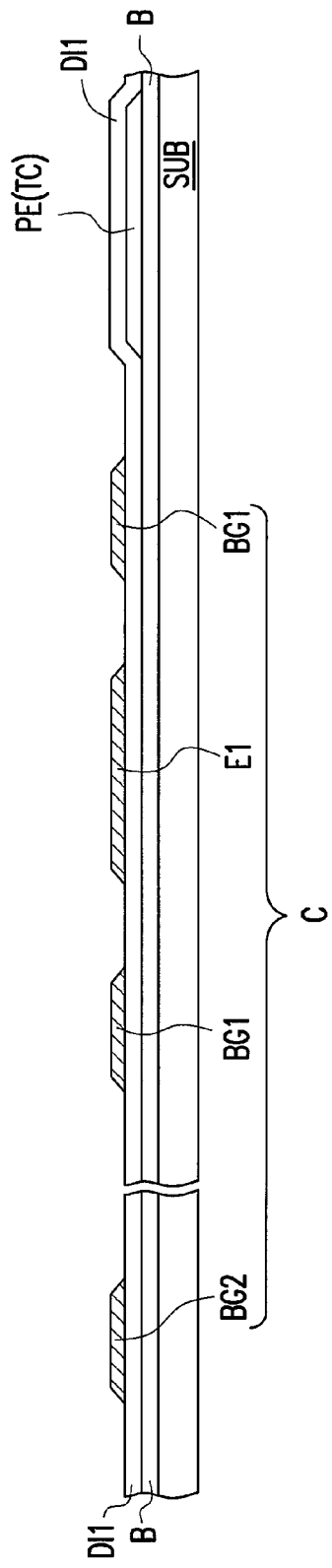
FIG. 4A
FIG. 4B

PHOTOELECTRIC ELEMENT, DISPLAY UNIT AND METHOD FOR FABRICATING THE SAME

CROSS-REFERENCE TO RELATED APPLICATION

This application claims the priority benefit of Taiwan application serial no. 99134242, filed on Oct. 7, 2010. The entirety of the above-mentioned patent application is hereby incorporated by reference herein and made a part of specification.

BACKGROUND

1. Field of the Disclosure

The disclosure relates to a display unit and a method for fabricating the same. Particularly, the disclosure relates to a display unit having an in-cell photoelectric element and a method for fabricating the same.

2. Related Art

Touch panels are roughly-grouped into resistive touch panels, capacitive touch panels, optical touch panels, acoustic wave touch panels and electromagnetic touch panels according to different sensing methods thereof. Since the optical touch panel not only has a touch control function but also has a scanner function, it is widely applied in various electronic products. In various types of the optical touch panels, a design of in-cell photoelectric element is popular, and a main reason thereof is that fabrication of the in-cell photoelectric element can be integrated with fabrication of a display panel, so that the display panel (touch display panel) having the in-cell photoelectric element may have a thinner thickness and lighter weight. However, research and development of the conventional display panel having the in-cell photoelectric element is still in a primary stage, so that it is still a research and development focus for fabricating a low-cost and high-sensitivity touch display panel having a dual side photo-sensing function.

SUMMARY OF THE DISCLOSURE

An exemplary embodiment of the disclosure provides a photoelectric element including a transparent bottom electrode, a photosensitive layer, a first electrode, a second electrode and a transparent top electrode. The photosensitive layer is located above the transparent bottom electrode. The first electrode and the second electrode are disposed on the photosensitive layer. The transparent top electrode is located above the photosensitive layer.

Another exemplary embodiment of the disclosure provides a display unit, suitable for being disposed on a substrate. The display unit includes a pixel, a top electrode, a display medium and a photoelectric element. The pixel is disposed on the substrate and includes at least a thin film transistor and a pixel electrode. The thin film transistor includes a channel layer, a first bottom electrode, a first electrode and a second electrode, wherein the first bottom electrode is located below the channel layer, and the pixel electrode is electrically connected to the second electrode. The top electrode is located above the pixel electrode, and the display medium is located between the pixel electrode and the top electrode. The photoelectric element is disposed on the substrate and includes a photosensitive layer, a second bottom electrode, a third electrode and a fourth electrode, wherein the second bottom electrode is located below the photosensitive layer, and the top electrode extends to the top of the photosensitive layer.

Another exemplary embodiment of the disclosure provides a method for fabricating a display unit, which can be described as follows. A pixel electrode, at least a first bottom electrode and a second bottom electrode are formed, wherein the second bottom electrode and the first bottom electrode are simultaneously formed, or the second bottom electrode and the pixel electrode are simultaneously formed. An insulating layer is formed to cover the first bottom electrode, the second bottom electrode and a portion of the pixel electrode. A channel layer and a photosensitive player are simultaneously formed on the insulating layer, wherein the channel layer is located above the first bottom electrode, and the photosensitive layer is located above the second bottom electrode. A first electrode, a second electrode, a third electrode and a fourth electrode are simultaneously formed, wherein the first electrode and the second electrode contact the channel layer, and the third electrode and the fourth electrode contact the photosensitive layer. A display medium is formed on the pixel electrode. A top electrode is formed on the display medium, wherein the top electrode extends to the top of the photosensitive layer.

Another exemplary embodiment of the disclosure provides a dual side photo-sensing touch display panel including a substrate, a plurality of scan lines, a plurality of data lines, a plurality of pixels and a plurality of dual side photo-sensing photoelectric elements arranged in an array. The scan lines and the data lines are disposed on the substrate, wherein the scan lines and the data lines are intersected, and define a plurality of pixel regions on the substrate. The pixels are disposed in the pixel regions, and each of the pixels is electrically connected to the corresponding scan line and the corresponding data line, respectively. The dual side photo-sensing photoelectric elements are disposed on the substrate.

Another exemplary embodiment of the disclosure provides a dual side photo-sensing touch display panel including a substrate, a plurality of scan lines, a plurality of data lines, a plurality of pixels, a plurality of top side photo-sensing photoelectric elements arranged in an array and a plurality of bottom side photo-sensing photoelectric elements arranged in an array. The scan lines and the data lines are disposed on the substrate, wherein the scan lines and the data lines are intersected, and a plurality of pixel regions is defined on the substrate. The pixels are disposed in the pixel regions, and each of the pixels is electrically connected to the corresponding scan line and the corresponding data line, respectively. The top side photo-sensing photoelectric elements and the bottom side photo-sensing photoelectric elements are all disposed on the substrate.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIGS. 4A-4G are schematic diagrams illustrating a fabrication process of a display unit according to a third exemplary embodiment of the disclosure.

DETAILED DESCRIPTION OF DISCLOSED EMBODIMENTS

First Exemplary Embodiment

Figure 1:
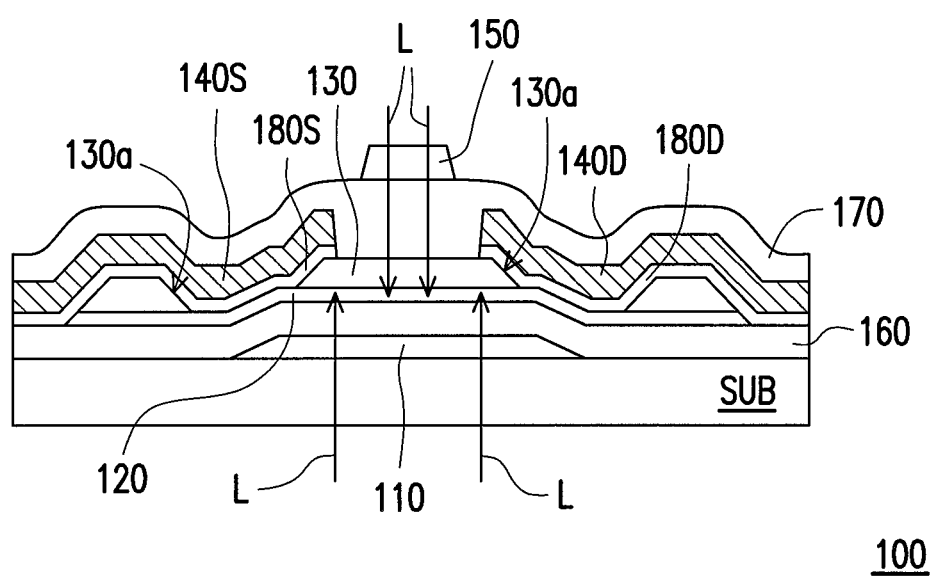
FIG. 1 is a cross-sectional view of a photoelectric element according to a first exemplary embodiment of the disclosure.

FIG. 1 is a cross-sectional view of a photoelectric element according to a first exemplary embodiment of the disclosure. Referring to FIG. 1, the photoelectric element 100 of the present exemplary embodiment is adapted to be fabricated on a substrate SUB, and includes a transparent bottom electrode 110, a photosensitive layer 120, a patterned dielectric layer 130, a first electrode 140S, a second electrode 140D and a transparent top electrode 150. The photosensitive layer 120 is located above the transparent bottom electrode 110. The patterned dielectric layer 130 covers the photosensitive layer 120, wherein the patterned dielectric layer 130 has two contact openings 130a, and the contact openings 130a respectively expose a portion of the photosensitive layer 120. The first electrode 140S and the second electrode 140D are disposed on a portion of the patterned dielectric layer 130 and the photosensitive layer 120 exposed by the two contact openings 130a. The transparent top electrode 150 is located above the photosensitive layer 120. It should be noticed that the patterned dielectric layer 130 of the present exemplary embodiment is a selective component, and in the photoelectric element 100 of other structures, the patterned dielectric layer 130 can be omitted.

The photoelectric element 100 of the present exemplary embodiment is, for example, a photoelectric transistor. When the photoelectric element is the photoelectric transistor, the transparent bottom electrode 110 is equivalent to a transparent bottom gate, the first electrode 140S and the second electrode 140D are equivalent to a source and a drain, and the transparent top electrode 150 is equivalent to a transparent top gate.

In the present exemplary embodiment, a material of the transparent bottom electrode 110 includes transparent conductive oxide (TCO). In detail, the material of the transparent bottom electrode 110 is, for example, indium tin oxide (ITO), or indium zinc oxide (IZO), etc. A material of the photosensitive layer 120 is, for example, amorphous silicon (a-Si), other thin film layers sensitive to light or electromagnetic radiations or other suitable semiconductor materials. It should be noticed that a thickness of the photosensitive layer 120 is, for example, between 100 nm and 200 nm.

A material of the patterned dielectric layer 130 includes silicon nitride (SiNx), silicon oxide (SiOx) or other suitable dielectric materials. In the present exemplary embodiment, the patterned dielectric layer 130 can be formed by a single layer of the dielectric material, or multiple layers of the dielectric materials stacked on each other, for example, a composite layer of SiNx/SiOx. Moreover, the material of the patterned dielectric layer 130 is, for example, an organic dielectric layer or an organic-inorganic hybrid dielectric layer.

A material of the first electrode 140S and the second electrode 140D includes metal. For example, the material of the first electrode 140S and the second electrode 140D can be a composite layer of three layers of metals, for example, titanium/aluminium/titanium (Ti/Al/Ti), molybdenum/aluminium/molybdenum (Mo/Al/Mo), chromium/aluminium/chromium (Cr/Al/Cr), molybdenum/aluminium/titanium (Mo/Al/Ti), etc. Certainly, in the present exemplary embodiment, the first electrode 140S and the second electrode 140D are not limited to be respectively formed by the composite layer of three layers of metals. For example, the material of the first electrode 140S and the second electrode 140D can be titanium, aluminium, molybdenum or other single conductive materials. Moreover, a material of the transparent top electrode 150 includes transparent conductive oxide (TCO). In detail, the material of the transparent top electrode 150 is, for example, indium tin oxide (ITO), or indium zinc oxide (IZO), etc.

According to FIG. 1, it is known that the photoelectric element 100 of the present exemplary embodiment may further include an insulating layer 160, and the insulating layer 160 covers the transparent bottom electrode 110, and the photosensitive layer 120 is disposed on the insulating layer 160. Similarly, a material of the insulating layer 160 includes silicon nitride (SiNx), silicon oxide (SiOx) or other suitable dielectric materials. In the present exemplary embodiment, the insulating layer 160 can be formed by a single layer of the dielectric material, or multiple layers of the dielectric materials stacked on each other, for example, a composite layer of SiNx/SiOx. Moreover, the material of the insulating layer 160 is, for example, an organic dielectric layer or an organic-inorganic hybrid dielectric layer.

The photoelectric element 100 of the present exemplary embodiment may further include a passivation layer 170. The passivation layer 170 covers the first electrode 140S, the second electrode 140D and the patterned dielectric layer 130, wherein the transparent top electrode 150 is disposed on the passivation layer 170. In the present exemplary embodiment, a material of the passivation layer 170 includes silicon nitride (SiNx) or silicon oxide (SiOx). For example, the passivation layer 170 can be formed by a single layer of the dielectric material, or multiple layers of the dielectric materials stacked on each other, for example, a composite layer of SiNx/SiOx. Moreover, the material of the passivation layer 170 is, for example, an organic dielectric layer or an organic-inorganic hybrid dielectric layer.

To further reduce a contact impedance between the first electrode 140S and the photosensitive layer 120 and a contact impedance between the second electrode layer 140D and the photosensitive layer 120, the photoelectric element 100 of the present exemplary embodiment may further include two ohmic contact layers 180S and 180D, wherein the ohmic contact layer 180S is disposed between the first electrode 140S and the photosensitive layer 120, and the ohmic contact layer 180D is disposed between the second electrode 140D and the photosensitive layer 120. In the present exemplary embodiment, a material of the ohmic contact layers 180S and 180D is, for example, n$^+$ doped micro-crystalline Si, n$^+$ doped MoSi, n$^+$ doped CrSi, or n$^+$ doped TiSi, etc.

Since the photoelectric element 100 of the present exemplary embodiment has the transparent bottom electrode 110 and the transparent top electrode 150, light L can pass through the transparent bottom electrode 110 and the transparent top electrode 150 to irradiate the photosensitive layer 120. In other words, the photosensitive layer 120 has a dual side photo-sensing function. Moreover, since the photosensitive layer 120 is controlled by two electrodes (i.e. the transparent bottom electrode 110 and the transparent top electrode 150), the photosensitive layer 120 may have a relatively large thickness, and in case that the photosensitive layer 120 is relatively thick, a photo-sensing sensitivity of the photoelectric element 100 is also improved. Moreover, since the photoelectric element 100 has two electrodes (i.e. the transparent bottom electrode 110 and the transparent top electrode 150), the photoelectric element 100 may have a better photo-sensing sensitivity, and is not liable to have a threshold voltage shift ($V_{th}$ shift) phenomenon and a breakdown phenomenon.

Second Exemplary Embodiment

The photoelectric element 100 mentioned in the first exemplary embodiment can be further applied to a display unit (for example, a display panel having a touch control function or a display panel having a scanner function), and a method for fabricating the display unit is described in detail below with reference of FIG. 2A to FIG. 2G.

Figure 2A:
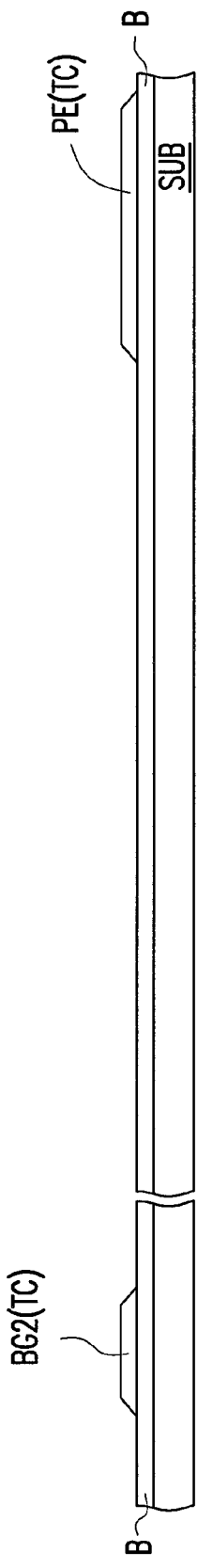
FIGS. 2A-2G are schematic diagrams illustrating a fabrication process of a display unit according to a second exemplary embodiment of the disclosure.

FIGS. 2A-2G are schematic diagrams illustrating a fabrication process of a display unit according to a second exemplary embodiment of the disclosure. Referring to FIG. 2A, a transparent conductive layer TC is first formed on a substrate SUB, wherein the transparent conductive layer TC includes a second bottom electrode BG2 and a pixel electrode PE. In the present exemplary embodiment, a material of the transparent conductive layer TC comprises transparent conductive oxide (TCO). In detail, the material of the transparent conductive layer TC is, for example, indium tin oxide (ITO), or indium zinc oxide (IZO), etc. In other embodiments, before the transparent conductive layer TC is formed, a buffer layer B can be first formed on the substrate SUB, and a material of the buffer layer B includes silicon nitride (SiNx), silicon oxide (SiOx) or other suitable dielectric materials. In the present exemplary embodiment, the buffer layer B can be formed by a single layer of the dielectric material, or multiple layers of the dielectric materials stacked on each other, for example, a composite layer of SiNx/SiOx. Moreover, the material of the buffer layer B is, for example, an organic dielectric layer or an organic-inorganic hybrid dielectric layer.

Figure 2B:
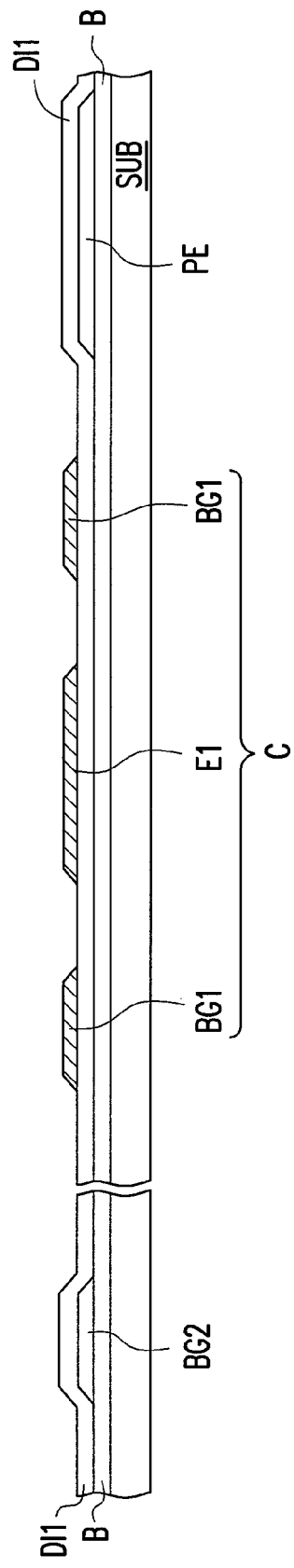

Then, referring to FIG. 2B, a first dielectric layer DI1 is formed on the substrate SUB to cover the transparent conductive layer TC. In the present exemplary embodiment, a material of the first dielectric layer DI1 includes silicon nitride (SiNx), silicon oxide (SiOx) or other suitable dielectric materials. For example, the first dielectric layer DI1 can be formed by a single layer of the dielectric material, or multiple layers of the dielectric materials stacked on each other, for example, a composite layer of SiNx/SiOx. Moreover, the material of the first dielectric layer DI1 is, for example, an organic dielectric layer or an organic-inorganic hybrid dielectric layer.

After the first dielectric layer DI1 is formed, a patterned conductive layer C is formed on the first dielectric layer DI1, and the patterned conductive layer C includes one or a plurality of first bottom electrodes BG1, and in the present exemplary embodiment, two first bottom electrodes BG1 are taken as an example. The patterned conductive layer C may further include a capacitor bottom electrode E1. Generally, a material of the patterned conductive layer C includes metal, which can be a single layer of metal or a composite layer of multiple layers of metals. For example, the material of the patterned conductive layer C is, for example, a composite layer of three layers of metals, for example, titanium/aluminium/titanium (Ti/Al/Ti), molybdenum/aluminium/molybdenum (Mo/Al/Mo), chromium/aluminium/chromium (Cr/Al/Cr), molybdenum/aluminium/titanium (Mo/Al/Ti), etc. Certainly, in the present exemplary embodiment, the patterned conductive layer C is not limited to be formed by the composite layer of three layers of metals. For example, the material of the patterned conductive layer C can be titanium/aluminium/molybdenum/chromium (Ti/Al/Mo/Cr).

Figure 2C:
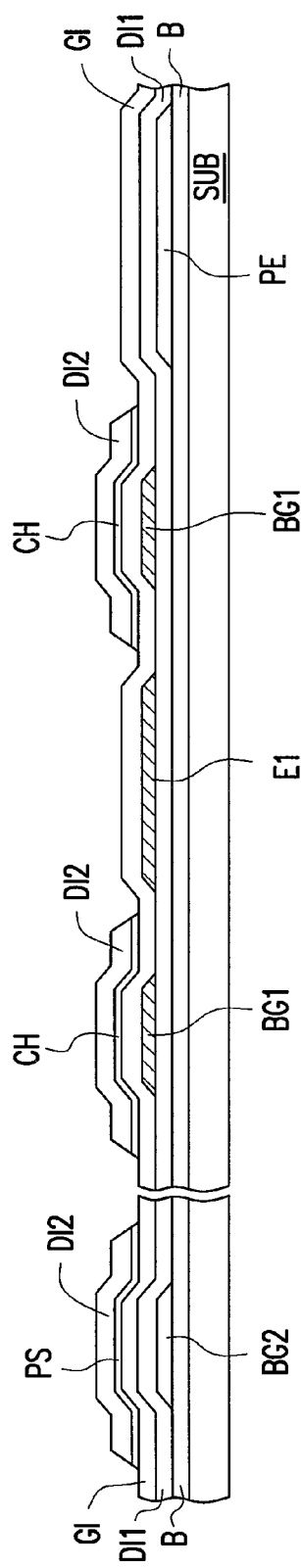

Referring to FIG. 2C, an insulating layer GI is formed to cover the first bottom electrode BG1, and a semiconductor layer (not shown) and a second dielectric layer (not shown) are sequentially formed on the insulating layer GI. Then, the semiconductor layer and the second dielectric layer are patterned to form a channel layer CH, a photosensitive layer PS and a patterned dielectric layer DI2 covering the channel layer CH and the photosensitive layer PS, wherein materials of the channel layer CH and the photosensitive layer PS can be the same, the channel layer CH is located above the first bottom electrode BG1, and the photosensitive layer PS is located above the second bottom electrode BG2. In the present exemplary embodiment, a material of the insulating layer GI includes silicon nitride (SiNx), silicon oxide (SiOx) or other suitable dielectric materials. For example, the insulating layer GI can be formed by a single layer of the dielectric material, or multiple layers of the dielectric materials stacked on each other, for example, a composite layer of SiNx/SiOx. Moreover, the material of the insulating layer GI is, for example, an organic dielectric layer or an organic-inorganic hybrid dielectric layer.

Figure 2D:
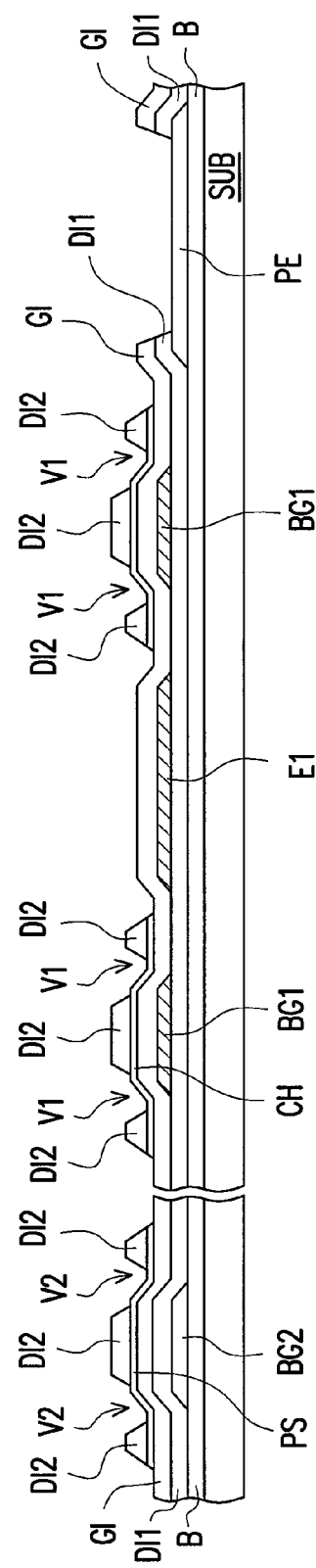

Referring to FIG. 2D, the insulating layer GI, the first dielectric layer DI1 and the patterned dielectric layer DI2 are patterned to expose a portion of the pixel electrode PE, and form a first contact opening V1 and a second contact opening V2 in the patterned dielectric layer DI2, wherein the first contact opening V1 exposes a portion of the channel layer CH, and the second contact opening V2 exposes a portion of the photosensitive layer PS.

Figure 2E:
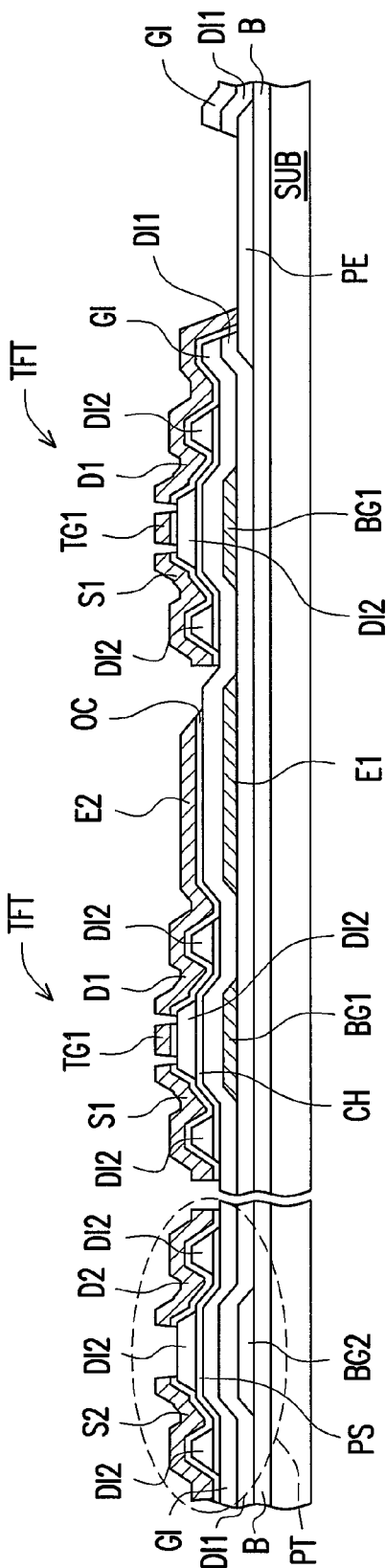

Referring to FIG. 2E, a first electrode S1, a second electrode D1, a third electrode S2 and a fourth electrode D2 are simultaneously formed, wherein the first electrode S1 and the second electrode D1 contact the channel layer CH, and the third electrode S2 and the fourth electrode D2 contact the photosensitive layer PS. In detail, the first electrode S1 and the second electrode D1 respectively contact the channel layer CH through the first contact opening V1, and the third electrode S2 and the fourth electrode D2 respectively contact the photosensitive layer PS through the second contact opening V2. It should be noticed that while the first electrode S1, the second electrode D1, the third electrode S2 and the fourth electrode D2 are fabricated, a capacitor top electrode E2 can be selectively formed above the capacitor bottom electrode E1. Moreover, while the first electrode S1, the second electrode D1, the third electrode S2 and the fourth electrode D2 are fabricated, a first top electrode TG1 can be selectively formed on the patterned dielectric layer DI2 above the first bottom electrode BG1, so that the channel layer CH is located between the first bottom electrode BG1 and the first top electrode TG1.

It should be noticed that before the first electrode S1, the second electrode D1, the third electrode S2 and the fourth electrode D2 are fabricated, an ohmic contact layer OC can be fabricated under the first electrode S1, the second electrode D1, the third electrode S2 and the fourth electrode D2.

After the first electrode S1, the second electrode D1, the third electrode S2 and the fourth electrode D2 are fabricated, fabrication of a thin film transistor TFT and a photoelectric element PT is primarily completed.

Figure 2F:
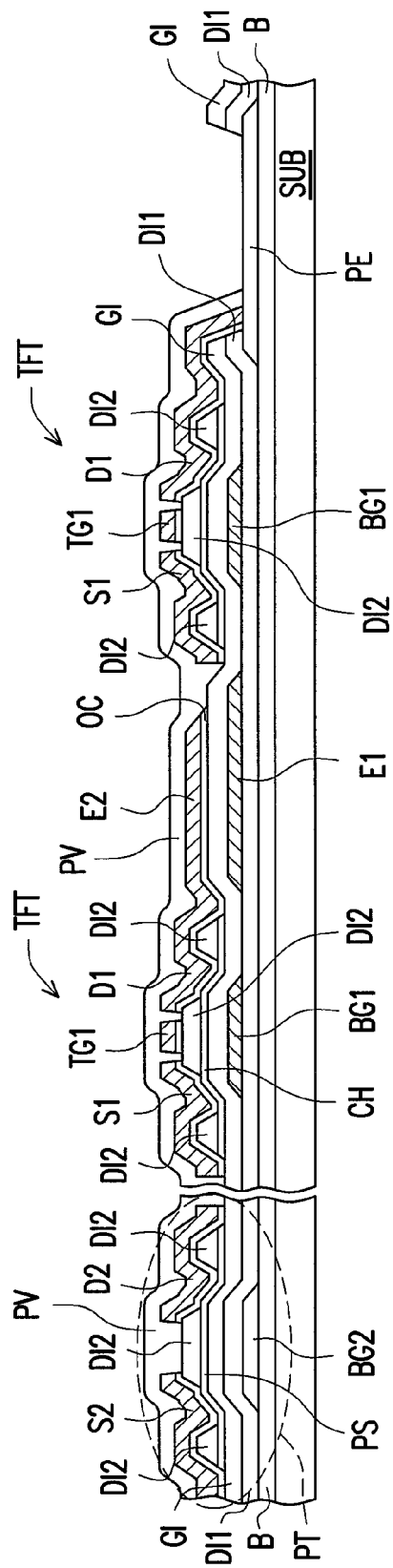

Referring to FIG. 2F, a passivation layer PV is formed to cover the first electrode S1, the second electrode D1, the third electrode S2, the fourth electrode D2 and the patterned dielectric layer DI2, wherein the passivation layer PV exposes a portion of the pixel electrode PE. In the present exemplary embodiment, a material of the passivation layer PV includes silicon nitride (SiNx), silicon oxide (SiOx) or other suitable dielectric materials. For example, the passivation layer PV can be formed by a single layer of the dielectric material, or multiple layers of the dielectric materials stacked on each other, for example, a composite layer of SiNx/SiOx. Moreover, the material of the passivation layer PV is, for example, an organic dielectric layer or an organic-inorganic hybrid dielectric layer.

Figure 2G:
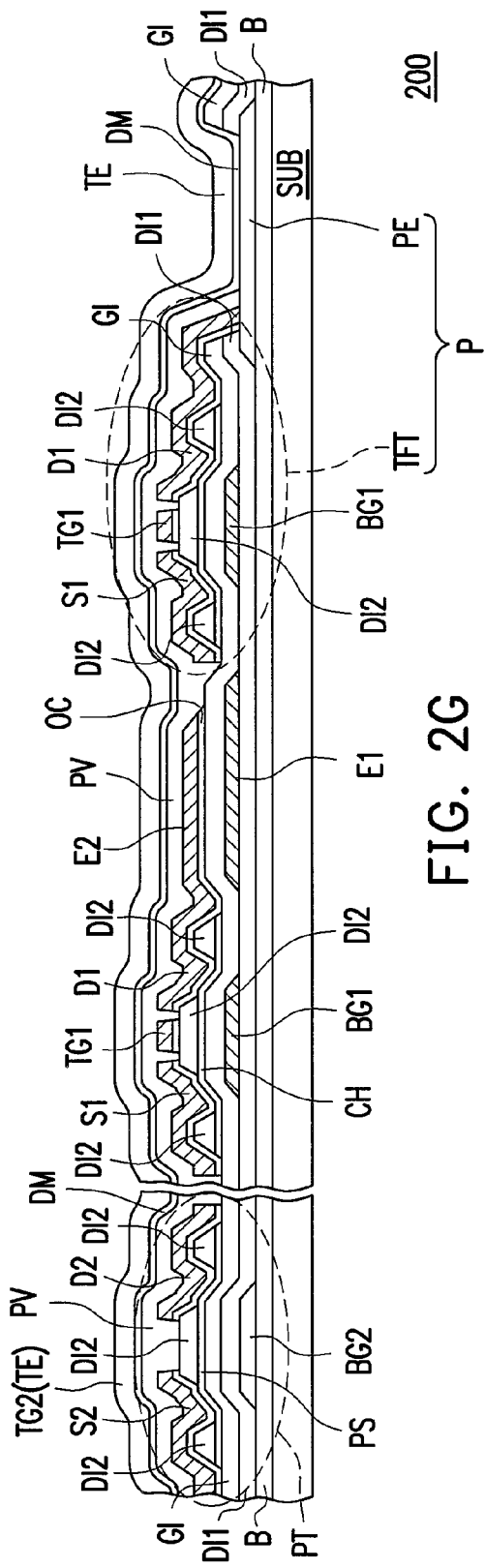

Referring to FIG. 2G, a display medium DM is formed on the pixel electrode PE, and a top electrode TE is formed on the display medium DM, wherein the top electrode TE extends to the top of the photosensitive layer PS to serve as a second top electrode TG2 of the photoelectric element PT. In the present exemplary embodiment, a material of the top electrode TE includes transparent conductive oxide (TCO). In detail, the material of the top electrode TE is, for example, indium tin oxide (ITO), or indium zinc oxide (IZO), etc.

It should be noticed that the display medium DM is, for example, an organic electro-luminescent layer. However, the material of the display medium DM is not limited by the disclosure, and other self-luminescent materials or light valve materials can also be used.

Since a structure of the photoelectric element PT of the present exemplary embodiment is similar to that of the photoelectric element 100 of the first exemplary embodiment, the photoelectric element PT of the present exemplary embodiment also has a better photo-sensing sensitivity, and is not liable to have the threshold voltage shift ($V_{th}$ shift) phenomenon and the breakdown phenomenon.

According to FIG. 2G, it is known that the display unit 200 is disposed on the substrate SUB, and the display unit 200 includes a pixel P, a top electrode TE, a display medium DM and a photoelectric element PT, wherein the pixel P includes at least the thin film transistor TFT and the pixel electrode PE. The thin film transistor TFT includes the channel layer CH, the first bottom electrode BG1, the first electrode S1 and the second electrode D1, and the pixel electrode PE is electrically connected to the second electrode D1. Moreover, the photoelectric element PT includes the photosensitive layer PS, the second bottom electrode BG2, the third electrode S2 and the fourth electrode D2, wherein materials of the second bottom electrode BG2, the top electrode TE and the pixel electrode PE can all be a transparent conductive material, and the top electrode TE extends to the top of the photosensitive layer PS. It should be noticed that the pixel P has a dual side light-emitting function, and the photoelectric element PT has a dual side photo-sensing function.

Figure 3:
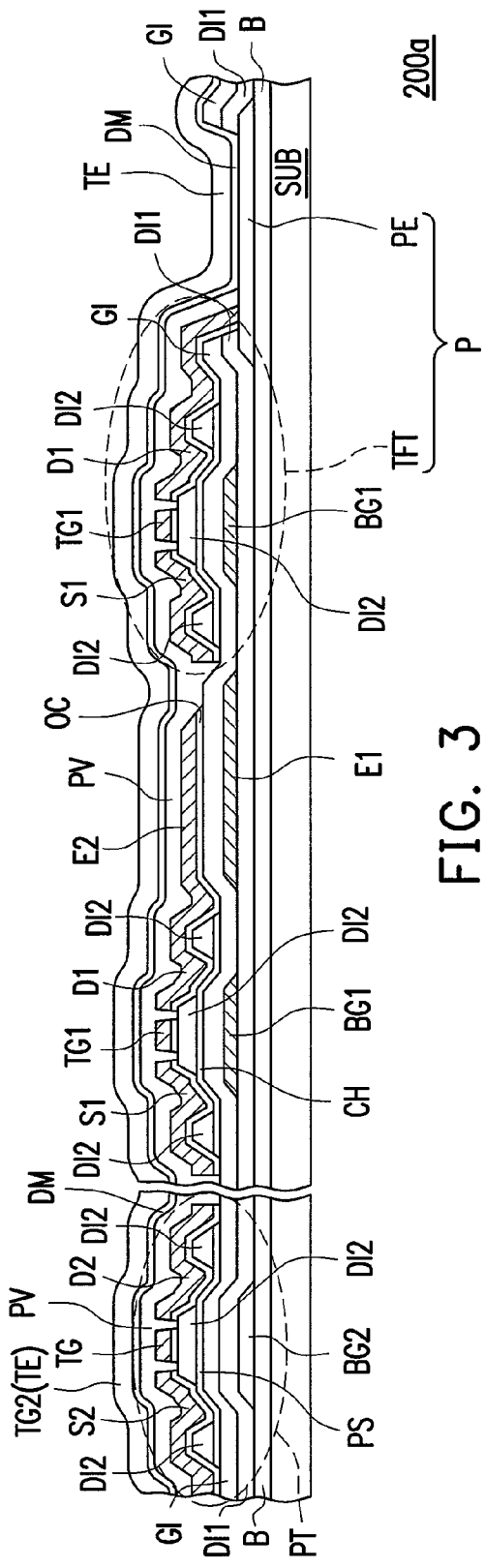
FIG. 3 is a cross-sectional view of another display unit according to the second exemplary embodiment of the disclosure.
Figure 4C:
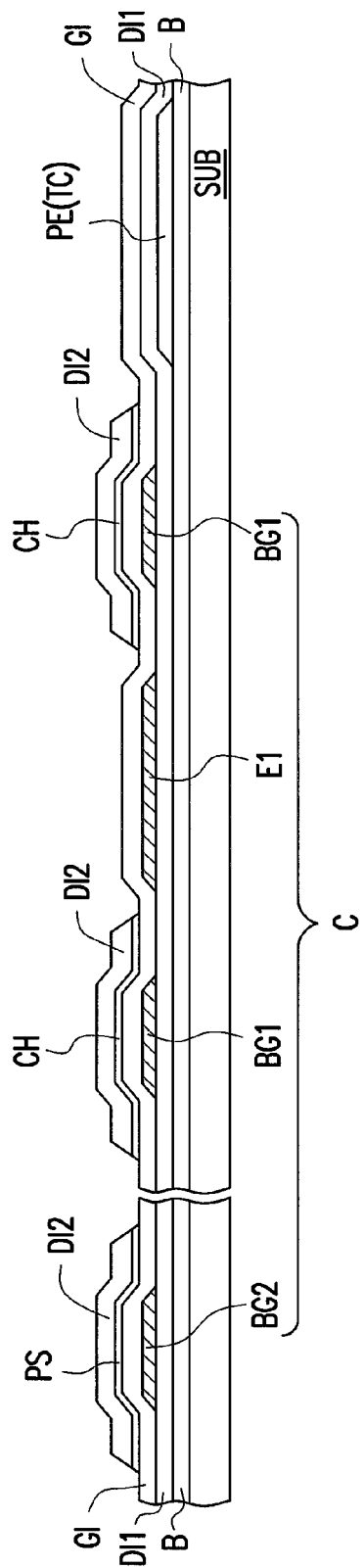
Figure 4D:
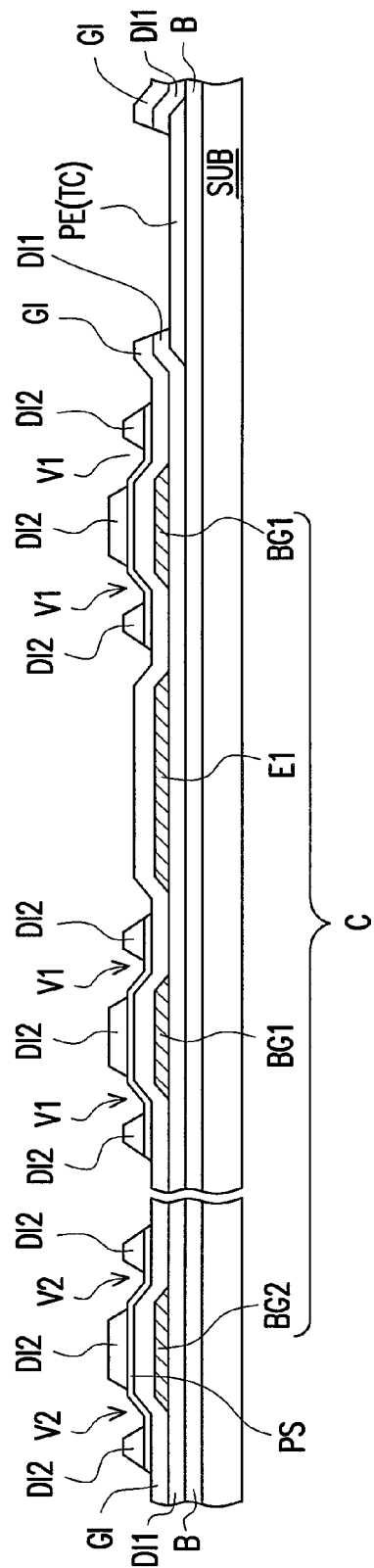
Figure 4E:
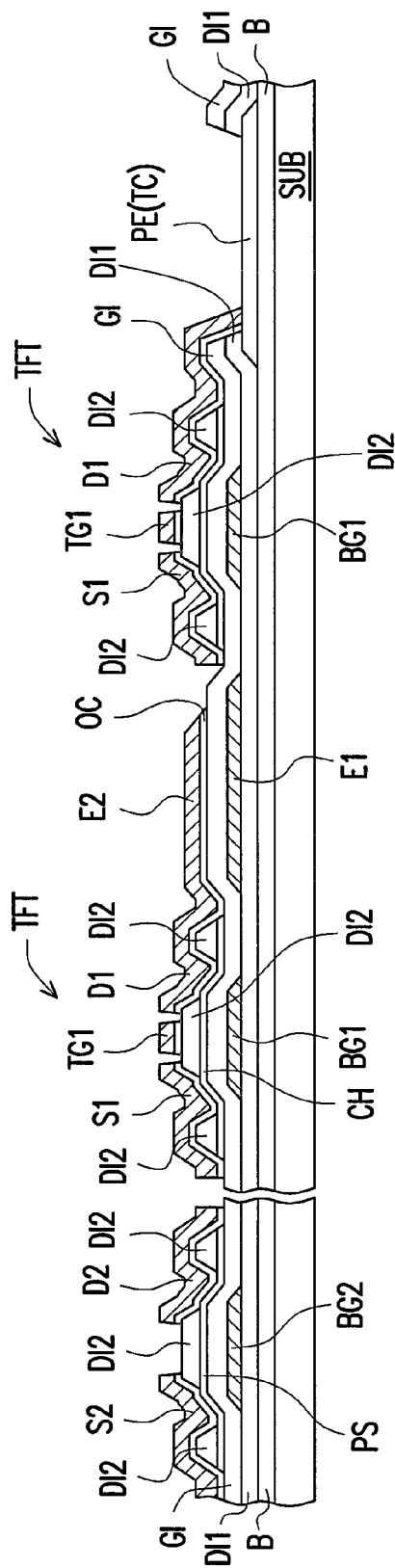
Figure 4F:
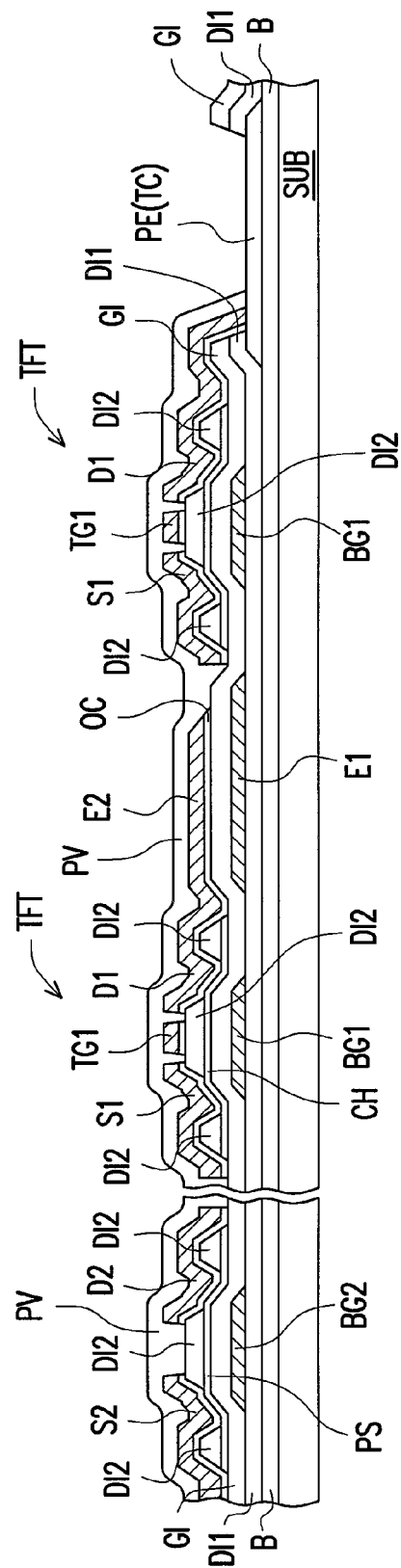
Figure 4G:
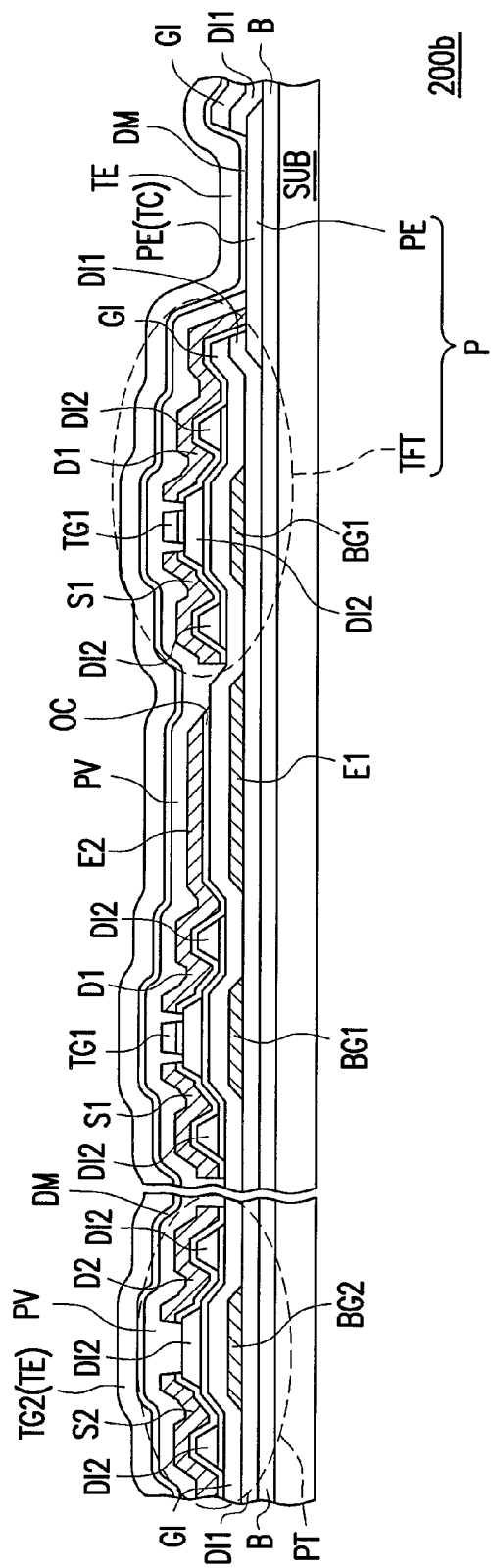

FIG. 3 is a cross-sectional view of another display unit according to the second exemplary embodiment of the disclosure. The display unit 200a of the present exemplary embodiment is similar to the aforementioned display unit 200, and a difference there between is that the photoelectric element PT in the display unit 200a further includes an opaque top electrode TG located above the photosensitive layer PS, and the opaque top electrode TG is located between the third electrode S2 and the fourth electrode D2. It should be noticed that the opaque top electrode TG can be fabricated together with the first electrode S1, the second electrode D1, the third electrode S2 and the fourth electrode D2, so that materials of the opaque top electrode TG, the first electrode S1, the second electrode D1, the third electrode S2 and the fourth electrode D2 are the same.

According to the above descriptions, the pixel P has a dual side light-emitting function, and the photoelectric element PT has a dual side photo-sensing function.

Third Exemplary Embodiment

FIGS. 4A-4G are schematic diagrams illustrating a fabrication process of a display unit according to a third exemplary embodiment of the disclosure. Referring to FIGS. 4A-4G, a method for fabricating the display unit 200b (shown in FIG. 4G) of the present exemplary embodiment is similar as that disclosed in the second exemplary embodiment, and a difference there between lies in a method of forming the second bottom electrode BG2, as that shown in FIG. 4A and FIG. 4B. The difference is described in detail below with reference of FIG. 4A and FIG. 4B. Fabrication steps of FIGS. 4C-4G are similar to that of FIGS. 2C-2G, so that detailed descriptions thereof are not repeated.

Referring to FIG. 4A, a transparent conductive layer TC is first formed on the substrate SUB, the transparent conductive layer TC includes a pixel electrode PE. In the present exemplary embodiment, a material of the transparent conductive layer TC comprises transparent conductive oxide (TCO). In detail, the material of the transparent conductive layer TC is, for example, indium tin oxide (ITO), or indium zinc oxide (IZO), etc. In other embodiments, before the transparent conductive layer TC is formed, a buffer layer B can be first formed on the substrate SUB, and a material of the buffer layer B includes silicon nitride (SiNx), silicon oxide (SiOx) or other suitable dielectric materials. In the present exemplary embodiment, the buffer layer B can be formed by a single layer of the dielectric material, or multiple layers of the dielectric materials stacked on each other, for example, a composite layer of SiNx/SiOx. Moreover, the material of the buffer layer B is, for example, an organic dielectric layer or an organic-inorganic hybrid dielectric layer.

Then, referring to FIG. 4B, a first dielectric layer DI1 is formed on the substrate SUB to cover the transparent conductive layer TC. In the present exemplary embodiment, a material of the first dielectric layer DI1 includes silicon nitride (SiNx), silicon oxide (SiOx) or other suitable dielectric materials. For example, the first dielectric layer DI1 can be formed by a single layer of the dielectric material, or multiple layers of the dielectric materials stacked on each other, for example, a composite layer of SiNx/SiOx. Moreover, the material of the first dielectric layer DI1 is, for example, an organic dielectric layer or an organic-inorganic hybrid dielectric layer.

After the first dielectric layer DI1 is formed, a patterned conductive layer C is formed on the first dielectric layer DI1, and the patterned conductive layer C includes one or a plurality of first bottom electrodes BG1 and one or a plurality of second bottom electrodes BG2, and in the present exemplary embodiment, two first bottom electrodes BG1 and one second bottom electrode BG2 are taken as an example.

In the present exemplary embodiment, the patterned conductive layer C may further include a capacitor bottom electrode E1. Generally, a material of the patterned conductive layer C includes metal, which can be a single layer of metal or a composite layer of multiple layers of metals. For example, the material of the patterned conductive layer C is, for example, a composite layer of three layers of metals, for example, titanium/aluminium/titanium (Ti/Al/Ti), molybdenum/aluminium/molybdenum (Mo/Al/Mo), chromium/aluminium/chromium (Cr/Al/Cr), molybdenum/aluminium/titanium (Mo/Al/Ti), etc. Certainly, in the present exemplary embodiment, the patterned conductive layer C is not limited to be formed by the composite layer of three layers of metals. For example, the material of the patterned conductive layer C can be titanium/aluminium/molybdenum/chromium (Ti/Al/Mo/Cr). According to FIG. 4B, it is known that since the second bottom electrode BG2 is an opaque bottom electrode, the photoelectric element PT of the present exemplary embodiment only has a single side photo-sensing function.

Figure 5:
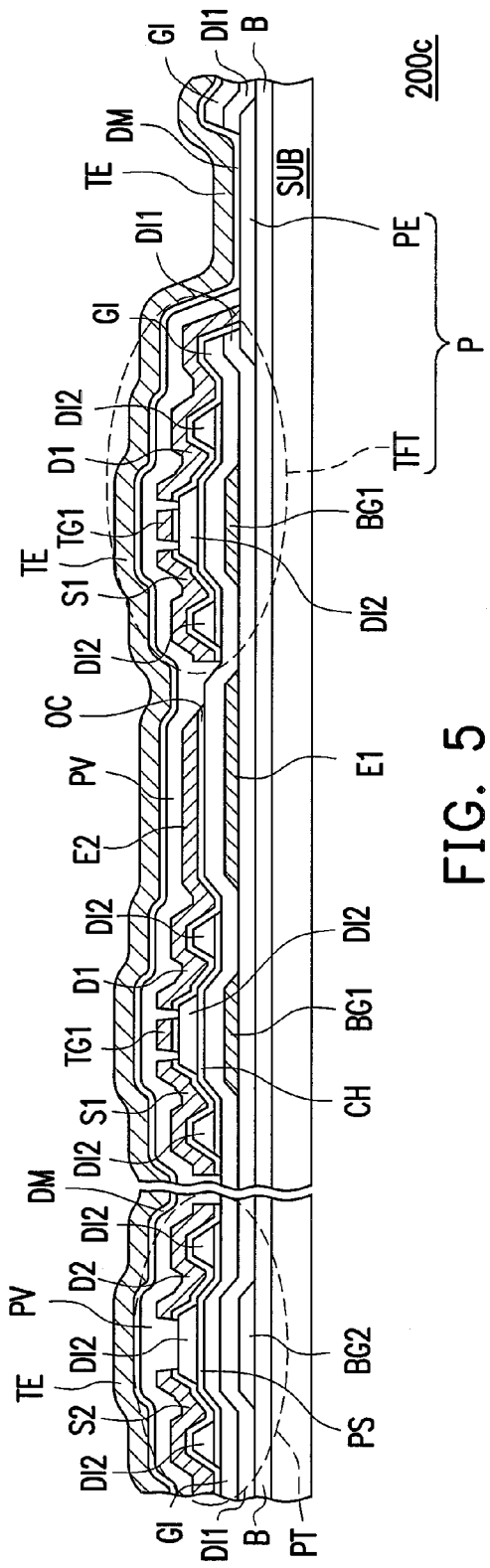
FIG. 5 is a cross-sectional view of another display unit according to the third exemplary embodiment of the disclosure.

FIG. 5 is a cross-sectional view of another display unit according to the third exemplary embodiment of the disclosure. The display unit 200c of the present exemplary embodiment is similar to the display unit 200 of FIG. 2G, and a difference there between is that the top electrode TE in the display unit 200c is an opaque top electrode. Obviously, the photoelectric element PT in the display unit 200c also only has the single side photo-sensing function.

Fourth Exemplary Embodiment

Figure 6:
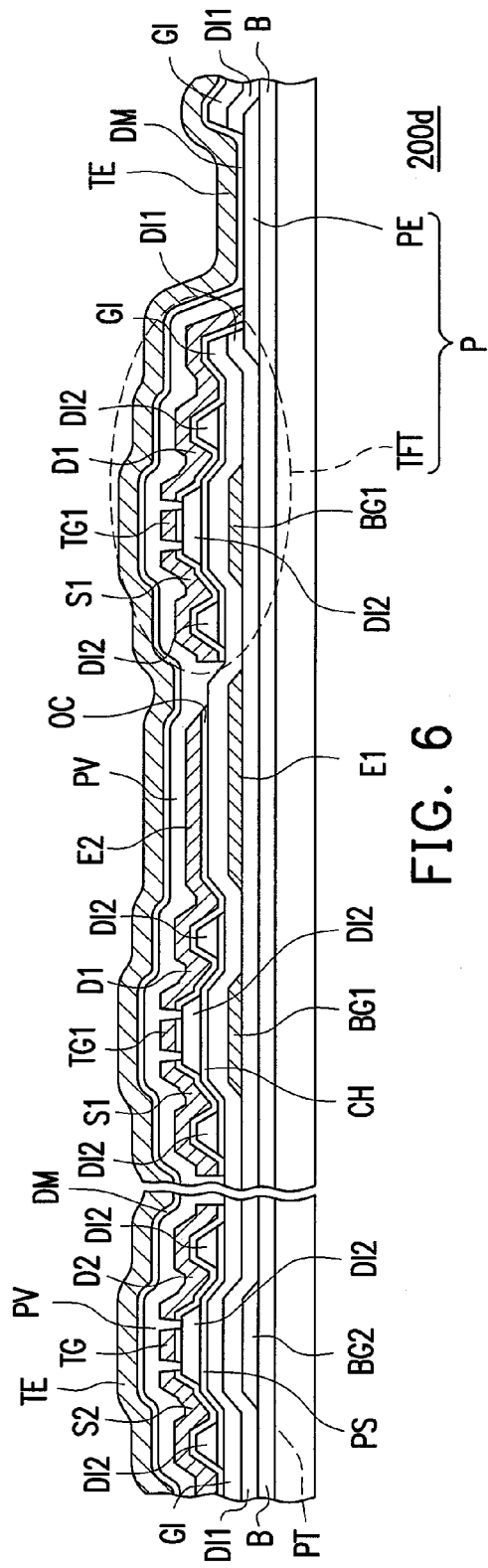
FIG. 6 is a cross-sectional view of a display unit according to a fourth exemplary embodiment of the disclosure.

FIG. 6 is a cross-sectional view of a display unit according to a fourth exemplary embodiment of the disclosure. Referring to FIG. 6, the display unit 200d of the present exemplary embodiment is similar to the display unit 200c of FIG. 5, and a difference there between is that the photoelectric element PT in the display unit 200d further includes an opaque top electrode TG located above the photosensitive layer PS, and the opaque top electrode TG is located between the third electrode S2 and the fourth electrode D2. In the present exemplary embodiment, the opaque top electrode TG can be fabricated together with the first electrode S1, the second electrode D1, the third electrode S2 and the fourth electrode D2, so that materials of the opaque top electrode TG, the first electrode S1, the second electrode D1, the third electrode S2 and the fourth electrode D2 are the same.

In summary, the photoelectric elements of the aforementioned exemplary embodiments can be integrated with existing display panels for touch sensing or scanning, and fabrication processes of the photoelectric elements are compatible to a fabrication process of the existing display panel. Moreover, the photoelectric element of the present exemplary embodiment has an excellent device characteristic.

Fifth Exemplary Embodiment

The single side photo-sensing photoelectric elements (including the top side photo-sensing photoelectric element and the bottom side photo-sensing photoelectric element) and the dual side photo-sensing photoelectric element PT have been described in detail in the aforementioned first to fourth exemplary embodiments, and in the present exemplary embodiment, applications of different types of the photoelectric elements PT in a dual side photo-sensing touch display panel are introduced below.

Figure 7:
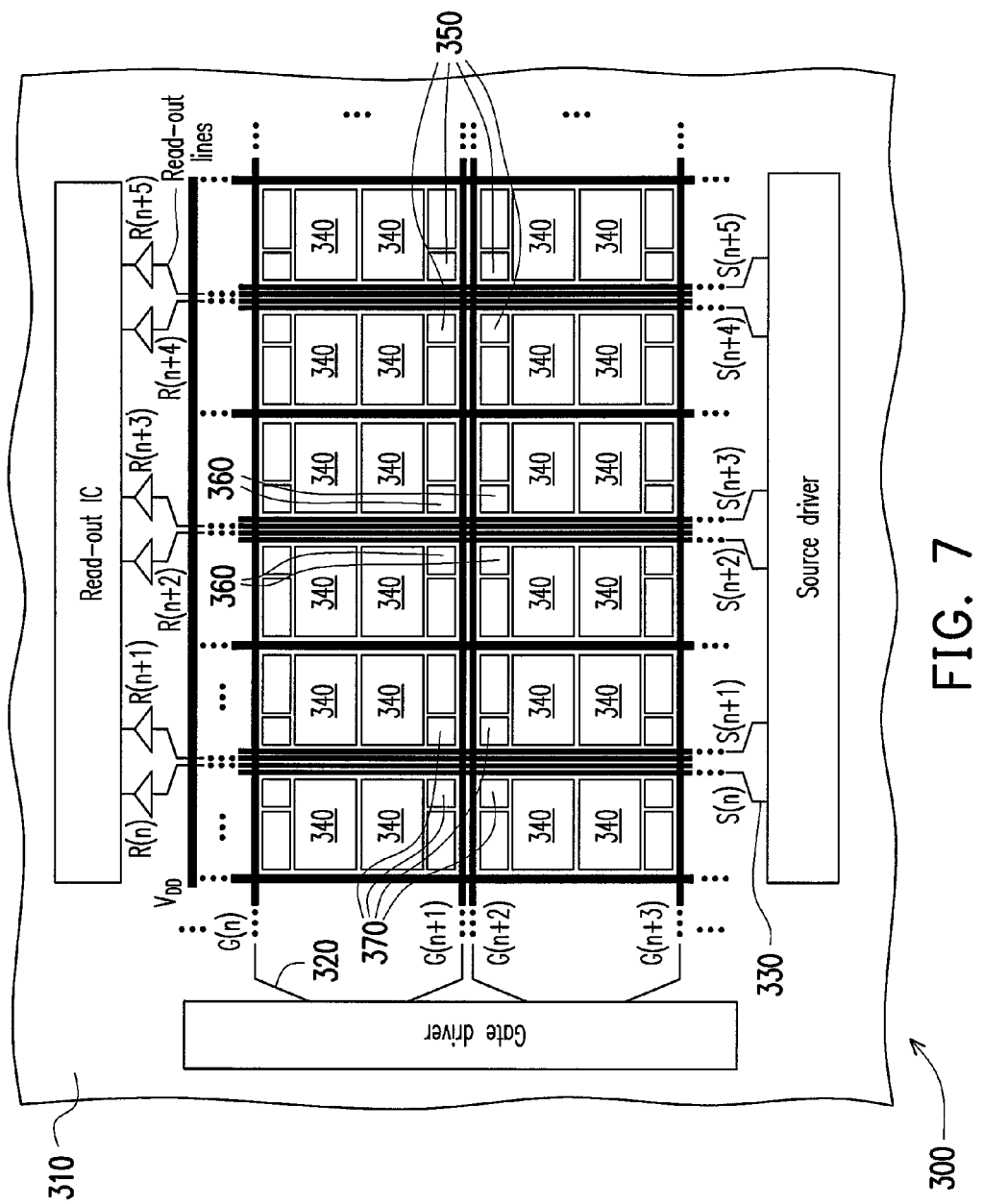
FIG. 7 is a schematic diagram illustrating a dual side photosensing touch display panel according to a fifth exemplary embodiment of the disclosure.

FIG. 7 is a schematic diagram illustrating a dual side photo-sensing touch display panel according to a fifth exemplary embodiment of the disclosure. Referring to FIG. 7, the dual side photo-sensing touch display panel 300 has a dual side photo-sensing function, and a user can input commands through both of two main surfaces of the dual side photo-sensing touch display panel 300 by touch. The dual side photo-sensing touch display panel 300 includes a substrate 310, a plurality of scan lines 320 connected to a gate driver, a plurality of data lines 330 connected to a source driver, a plurality of pixels 340 and a plurality of dual side photo-sensing photoelectric elements 350 arranged in an array. The scan lines 320, the data lines 330 and the dual side photo-sensing photoelectric elements 350 are all disposed on the substrate 310, and the data lines 330 are intersected to the scan lines 322 to define a plurality of pixel regions on the substrate 310. Moreover, the pixels 340 are disposed in the pixel regions, and each pixel 340 is electrically connected to the corresponding scan line 320 and the corresponding data line 330. Basically, the dual side photo-sensing touch display panel 300 already has the dual side photo-sensing function based on configuration of the dual side photo-sensing photoelectric elements 350, though in the present exemplary embodiment, a plurality of top side photo-sensing photoelectric elements 360 arranged in an array and/or a plurality of bottom side photo-sensing photoelectric elements 370 arranged in an array can be selectively disposed on the substrate 310. In detail, the dual side photo-sensing touch display panel 300 may simultaneously have the dual side photo-sensing photoelectric elements 350 and the top side photo-sensing photoelectric elements 360, alternatively, the dual side photo-sensing touch display panel 300 may simultaneously have the dual side photo-sensing photoelectric elements 350 and the bottom side photo-sensing photoelectric elements 370. Certainly, the dual side photo-sensing touch display panel 300 may simultaneously have the dual side photo-sensing photoelectric elements 350, the top side photo-sensing photoelectric elements 360 and the bottom side photo-sensing photoelectric elements 370.

In the present exemplary embodiment, the dual side photo-sensing touch display panel 300 may only have the top side photo-sensing photoelectric elements 360 and the bottom side photo-sensing photoelectric elements 370 without the dual side photo-sensing photoelectric elements 350.

According to the above descriptions, regardless of any type of the photoelectric element (350, 360 or 370), it can transmit sensing signals to a read-out integrated circuit (IC) through signal read-out lines, so as to facilitate interpreting the sensing signals. Moreover, arrangement and a required number of the photoelectric elements 350, 360 and 370 can be suitably adjusted according to an actual design requirement.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A dual side photo-sensing touch display panel, comprising:
   a substrate;
   a plurality of scan lines disposed on the substrate;
   a plurality of data lines disposed on the substrate and intersected to the scan lines, and the scan lines and the data lines defining a plurality of pixel regions on the substrate;
   a plurality of pixels disposed in the pixel regions, each of the pixels being electrically connected to the corresponding scan line and the corresponding data line, respectively, and each of the pixels comprising at least a thin film transistor and a pixel electrode, the thin film transistor comprising a channel layer, a first bottom electrode, a first electrode and a second electrode, wherein the first bottom electrode is located below the channel layer, and the pixel electrode is electrically connected to the second electrode;
   a top electrode located above the pixel electrode; and
   a plurality of dual side photo-sensing photoelectric elements arranged in an array and disposed on the substrate, and each of the dual side photo-sensing photoelectric elements comprising a photosensitive layer, a second bottom electrode, a third electrode and a fourth electrode, wherein the second bottom electrode is located below the photosensitive layer, the top electrode extends to the top of the photosensitive layer, the top electrode is a transparent top electrode, and each of the second bottom electrodes is a transparent bottom electrode.

2. The dual side photo-sensing touch display panel as claimed in claim 1, further comprising a plurality of top side photo-sensing photoelectric elements arranged in an array and disposed on the substrate.

3. The dual side photo-sensing touch display panel as claimed in claim 2, further comprising a plurality of bottom side photo-sensing photoelectric elements arranged in an array and disposed on the substrate.

4. The dual side photo-sensing touch display panel as claimed in claim 1, further comprising a plurality of bottom side photo-sensing photoelectric elements arranged in an array and disposed on the substrate.

5. A dual side photo-sensing touch display panel, comprising:
a substrate;
a plurality of scan lines disposed on the substrate;
a plurality of data lines disposed on the substrate and intersected to the scan lines, and the scan lines and the data lines defining a plurality of pixel regions on the substrate;
a plurality of pixels disposed in the pixel regions, each of the pixels being electrically connected to the corresponding scan line and the corresponding data line, respectively, and each of the pixels comprising at least a thin film transistor and a pixel electrode, the thin film transistor comprising a channel layer, a first bottom electrode, a first electrode and a second electrode, wherein the first bottom electrode is located below the channel layer, and the pixel electrode is electrically connected to the second electrode;
a top electrode located above the pixel electrode;
a plurality of top side photo-sensing photoelectric elements arranged in an array and disposed on the substrate, and each of the top side photo-sensing photoelectric elements comprising a first photosensitive layer, a second bottom electrode, a third electrode and a fourth electrode, wherein the second bottom electrode is located below the first photosensitive layer, the top electrode extends to the top of the first photosensitive layer; and
a plurality of bottom side photo-sensing photoelectric elements arranged in an array and disposed on the substrate, each of the bottom side photo-sensing photoelectric elements comprising a second photosensitive layer, a third bottom electrode, a fifth electrode, a sixth electrode and a opaque top electrode located above the second photosensitive layer, wherein the opaque top electrode is located between the fifth electrode and the sixth electrode, the third bottom electrode is located below the second photosensitive layer, the top electrode extends to the top of the second photosensitive layer, the top electrode is a transparent top electrode, each of the second bottom electrodes is a opaque bottom electrode, and each of the third bottom electrodes is a transparent bottom electrode.

* * * * *